United States Patent
Inumiya et al.

(10) Patent No.: US 8,183,641 B2
(45) Date of Patent: May 22, 2012

(54) SEMICONDUCTOR DEVICE AND METHOD FOR MANUFACTURING SAME

(75) Inventors: Seiji Inumiya, Carmel, NY (US); Tomonori Aoyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 12/626,216

(22) Filed: Nov. 25, 2009

(65) Prior Publication Data

US 2010/0133623 A1    Jun. 3, 2010

(30) Foreign Application Priority Data

Nov. 28, 2008    (JP) .................................. 2008-304725

(51) Int. Cl.
   *H01L 29/76* (2006.01)
(52) U.S. Cl. .. 257/369; 438/275; 438/199; 257/E21.639
(58) Field of Classification Search .................. 257/369, 257/410–411, E27.064, E21.639, E21.421, 257/E21.625; 438/221, 199, 216, 275, 283
See application file for complete search history.

(56) References Cited

U.S. PATENT DOCUMENTS

| | | | |
|---|---|---|---|
| 6,713,846 B1 * | 3/2004 | Senzaki | 257/635 |
| 6,844,234 B2 | 1/2005 | Eguchi et al. | |
| 6,936,901 B2 * | 8/2005 | Yamamoto | 257/410 |
| 7,807,990 B2 * | 10/2010 | Koyama et al. | 257/24 |
| 2009/0014809 A1 * | 1/2009 | Sekine et al. | 257/369 |
| 2009/0114996 A1 | 5/2009 | Inumiya et al. | |
| 2009/0283838 A1 * | 11/2009 | Park et al. | 257/369 |

FOREIGN PATENT DOCUMENTS

| | | |
|---|---|---|
| JP | 2008-537359 | 9/2008 |
| WO | WO 2006/115894 A2 | 11/2006 |

OTHER PUBLICATIONS

Narayanan et al., "Band-Edge High-Performance High-$\kappa$/Metal Gate-n-MOSFETs using Cap Layers Containing Group IIA and IIIB Elements with Gate-First Processing for 45 NM and Beyond," 2006 Symposium on VLSI technology Digest of Technical Papers (2006).
Kadoshima et al., "Fermi-level pinning position modulation by Al-containing metal gate for cost-effective dual-metal/dual-high-k CMOS," 2007 Symposium on VLSI Technology Digest of Technical Papers (2007), pp. 66-67.
Kubicek et al., "Strain enhanced Low-$V_T$ CMOS featuring La/Al-doped HfSiO/TaC and 10ps Invertor Delay," 2008 Symposium on VLSI Technology Digest of Technical Papers (2008), pp. 130-131.

* cited by examiner

*Primary Examiner* — David Vu
(74) *Attorney, Agent, or Firm* — Finnegan, Henderson, Farabow, Garrett & Dunner, L.L.P.

(57) ABSTRACT

A silicon oxynitride film is formed on entire surface of a semiconductor substrate, a lanthanum oxide film is formed on the silicon oxynitride film and the lanthanum oxide film is removed from a pMOS region. Then, a nitrided hafnium silicate film serving as a highly dielectric film is formed on the entire surface, an aluminum-containing titanium nitride film is formed, a polysilicon film is formed, and the stacked films are patterned into a gate electrode configuration. Next, impurities are introduced into a source/drain region, and an annealing for activating the impurities is utilized to diffuse the aluminum included in the aluminum-containing titanium nitride film to the interface between the silicon oxynitride film and the nitrided hafnium aluminum silicate film in the pMOS region.

7 Claims, 11 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2008-304725, filed on Nov. 28, 2008; the entire contents of which are incorporated herein by reference.

BACKGROUND OF THE INVENTION

1. Field of the Invention

The invention relates to a semiconductor device in which both an n-channel MOSFET and a p-channel MOSFET are formed and a method for manufacturing the same.

2. Background Art

Although gate insulating films are being made thinner to ensure the drain current in semiconductor devices in which MOSFETs (Metal Oxide Semiconductor Field Effect Transistors) are formed, making the gate insulating film thinner unfortunately increases the leak current due to tunneling. Therefore, the silicon oxide film and the silicon oxynitride film conventionally used as the gate insulating film have reached the physical limitations of film thickness reductions.

Therefore, to suppress the leak current while making the effective gate insulating film thinner, technology to form the gate insulating film of a high dielectric constant material, that is, technology using a so-called high-k gate insulating film, has been proposed. Materials having dielectric constants higher than the dielectric constants of silicon oxide and silicon oxynitride, e.g., $HfO_2$, HfSiO, and the like, may be used as the high dielectric constant material. Thereby, the electrical film thickness can be made thinner while maintaining a thick physical film thickness, and the drain current can be increased while suppressing the leak current.

On the other hand, in conventional gate electrodes made of polysilicon containing an impurity, a depletion layer undesirably forms around the interface with the gate insulating film, and the effective gate insulating film unfortunately increases. Therefore, technology using a metal electrode as the gate electrode has been proposed. Thus, the effective film thickness of the gate insulating film can be made thinner by using a high-k gate insulating film as the gate insulating film and using a metal electrode as the gate electrode.

However, in the case where such a high-k gate insulating film and metal gate electrode are used in a CMOS (Complementary MOSFET), the control of the threshold voltage of each of the MOSFETs is problematic. In other words, while the threshold voltage of a MOSFET depends on the work function of the material forming the gate electrode, the optimal work function of the electrode material differs for an n-channel MOSFET (hereinbelow also referred to as "nMOS") and a p-channel MOSFET (hereinbelow also referred to as "pMOS"). Specifically, it is necessary that the electrode material has a work function near the conduction band of silicon (about 4.05 eV) to reduce the threshold voltage of an nMOS; and it is necessary that the electrode material has a work function near the valence band of silicon (about 5.15 eV) to reduce the threshold voltage of a pMOS. Therefore, using an electrode material having a small work function to reduce the threshold voltage of the nMOS undesirably increases the threshold voltage of the pMOS; and using an electrode material having a large work function to reduce the threshold voltage of the pMOS undesirably increases the threshold voltage of the nMOS.

Therefore, technology has been proposed to use mutually different materials for the electrode material of the gate electrode of the nMOS and the electrode material of the gate electrode of the pMOS. For example, JP-A 2008-537359 (Kohyo) discusses technology to form the gate electrode of the nMOS from a metal having a work function of less than 4.2 eV and forming the gate electrode of the pMOS from a metal having a work function exceeding 4.9 eV. However, such a method requires separately forming the gate electrodes of the nMOS and the pMOS. Therefore, the manufacturing process of the semiconductor device is complex, and the manufacturing costs unfortunately increase.

SUMMARY OF THE INVENTION

According to an aspect of the invention, there is provided a semiconductor device including an nMOS region and a pMOS region set therein, the device including: a semiconductor substrate; a first insulating film including silicon and oxygen formed on the semiconductor substrate in the nMOS region and the pMOS region; a second insulating film formed on the first insulating film in the nMOS region; a third insulating film formed on the first insulating film in the pMOS region and on the second insulating film in the nMOS region, the third insulating film containing aluminum and having a dielectric constant higher than a dielectric constant of the first insulating film; and a conducting film containing aluminum formed on the third insulating film.

According to an aspect of the invention, there is provided a method for manufacturing a semiconductor device including an nMOS region and a pMOS region set therein, the method including: forming a first insulating film including silicon and oxygen on a semiconductor substrate in the nMOS region and the pMOS region; forming a second insulating film on the first insulating film in the nMOS region and the pMOS region; removing the second insulating film from the pMOS region; forming a third insulating film on the first insulating film of the pMOS region and on the second insulating film of the nMOS region, the third insulating film having a dielectric constant higher than a dielectric constant of the first insulating film; forming a conducting film containing aluminum on the third insulating film; and diffusing the aluminum contained in the conducting film to an interface between the first insulating film and the third insulating film in the pMOS region.

DETAILED DESCRIPTION OF THE INVENTION

Embodiments of the invention will now be described with reference to the drawings.

First, a first embodiment of the invention will be described.

A semiconductor device according to this embodiment is a device in which a CMOS is formed on a semiconductor substrate, a region is set where an n-channel MOSFET (hereinbelow referred to as "nMOS region") is formed, and a region is set where a p-channel MOSFET (hereinbelow referred to as "pMOS region") is formed.

A method for manufacturing the semiconductor device according to this embodiment will now be described.

FIG. 1 to FIG. 9 are process cross-sectional views illustrating the method for manufacturing the semiconductor device according to this embodiment.

Figure 10:
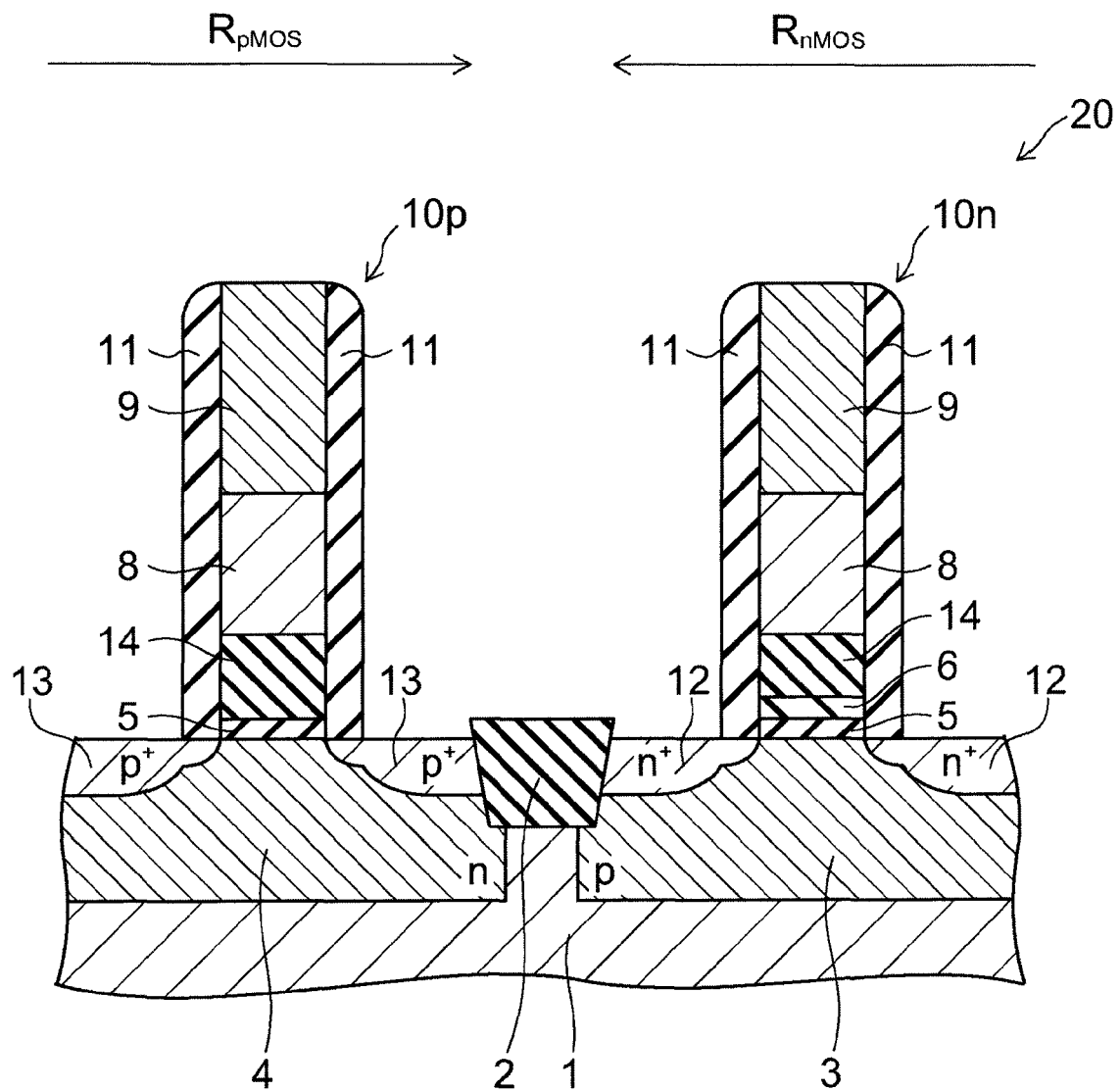
FIG. 10 is a cross-sectional view illustrating the semiconductor device according to the first embodiment.

FIG. 10 is a cross-sectional view illustrating the semiconductor device according to this embodiment.

Figure 1:
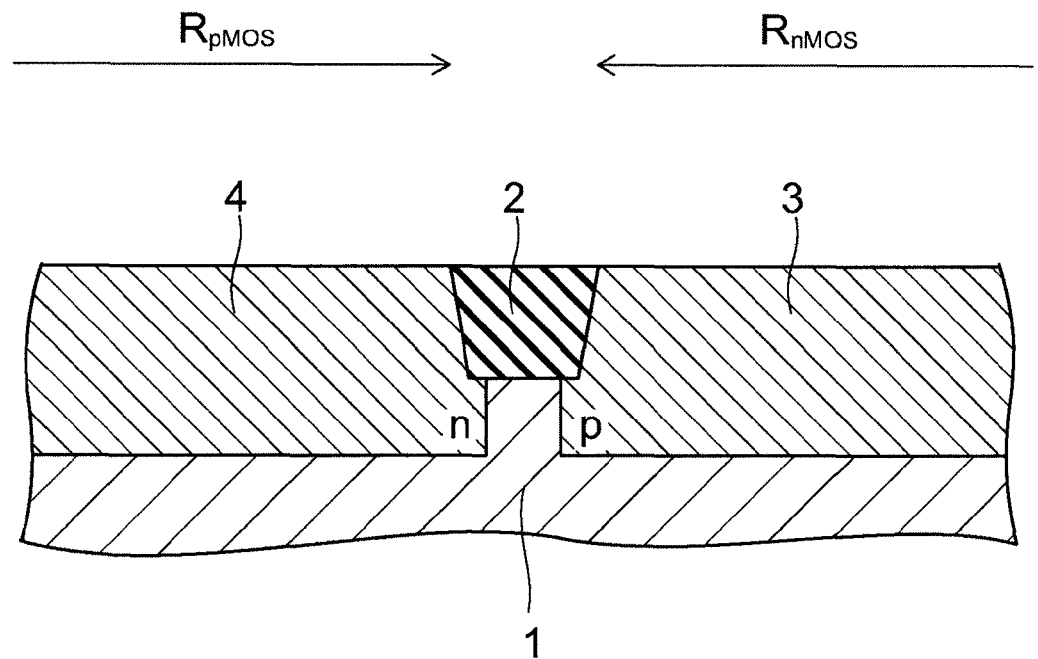
FIG. 1 to FIG. 9 are process cross-sectional views illustrating a method for manufacturing a semiconductor device according to a first embodiment of the invention.

First, as illustrated in FIG. 1, a semiconductor substrate 1 is prepared. The semiconductor substrate 1 is, for example, a monocrystalline silicon wafer. An nMOS region $R_{nMOS}$ and a pMOS region $R_{pMOS}$ are set in the semiconductor substrate 1. An element separation film 2 is formed in a boundary portion between the nMOS region $R_{nMOS}$ and the pMOS region $R_{pMOS}$ in an upper layer portion of the semiconductor substrate 1 using STI (Shallow Trench Isolation) technology. A p-type well 3 is formed in the upper layer portion of the semiconductor substrate 1 in the nMOS region $R_{nMOS}$. An n-type well 4 is formed in an upper layer portion of the semiconductor substrate 1 in the pMOS region $R_{pMOS}$.

Figure 2:
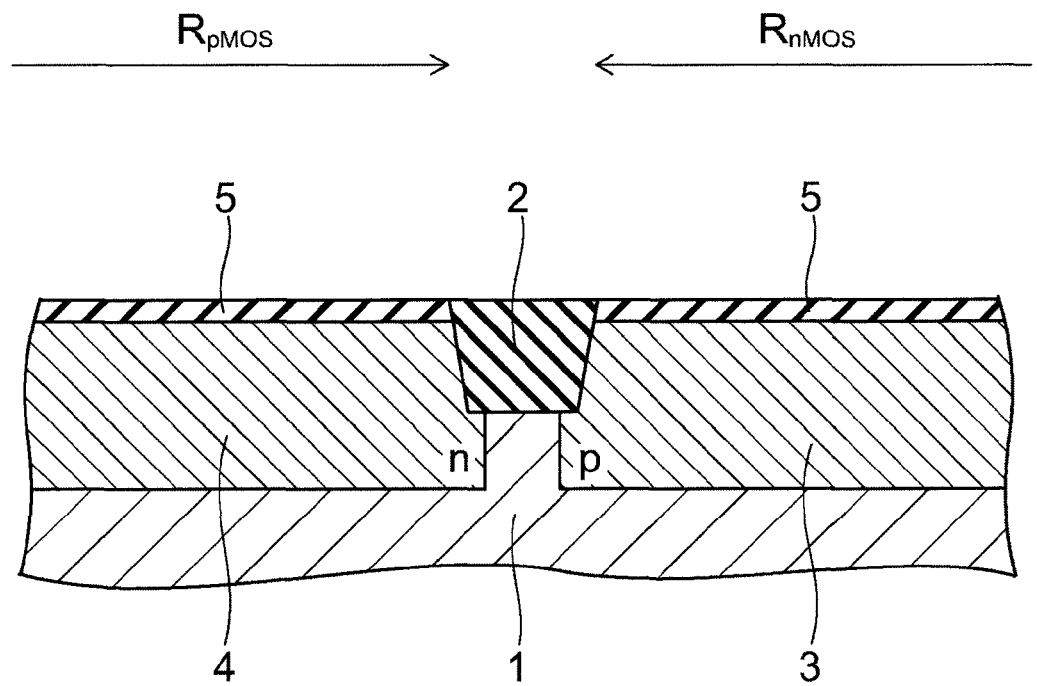

Then, as illustrated in FIG. 2, oxidation treatment such as thermal oxidation treatment or ozone water oxidation treatment is performed to form a silicon oxide film with a thickness of, for example, 1.0 nm on the upper face of the semiconductor substrate 1 in the region of exposed silicon. Subsequently, nitriding such as plasma nitriding is performed to introduce nitrogen into the silicon oxide film. Thereby, a silicon oxynitride film 5 (the first insulating film) is formed on the semiconductor substrate 1. The silicon oxynitride film 5 is made of silicon oxynitride (SiON) and is formed in both the nMOS region $R_{nMOS}$ and the pMOS region $R_{pMOS}$.

Figure 3:
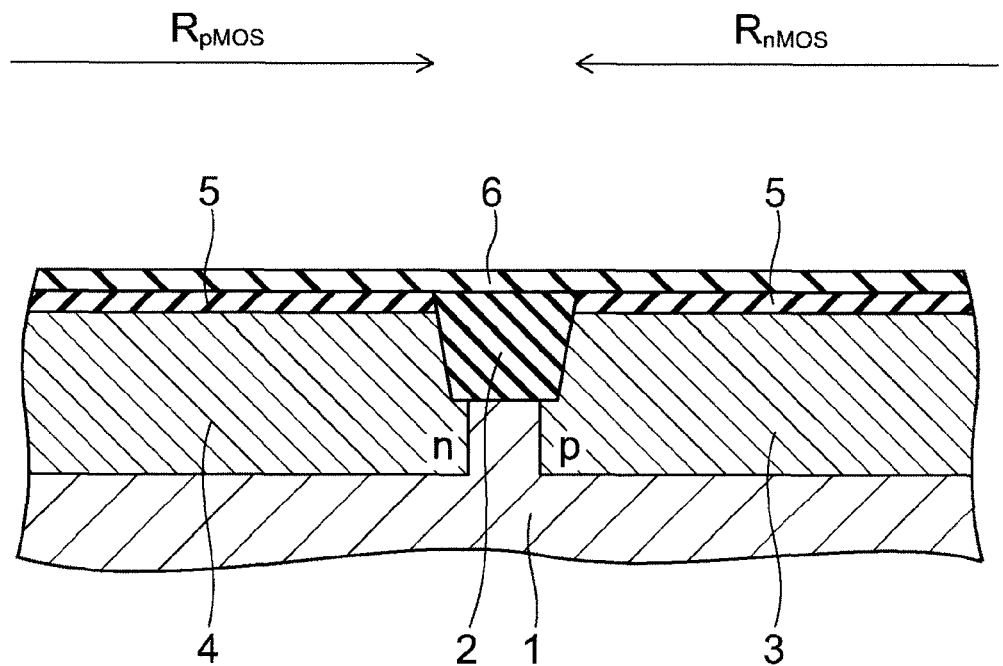

Continuing as illustrated in FIG. 3, lanthanum (La) is deposited on the entire surface of the silicon oxynitride film 5 by PVD (Physical Vapor Deposition). The deposition thickness of the lanthanum is, for example, 0.2 nm. Then, the lanthanum deposition film is oxidized by exposure to ambient air and changed into a lanthanum oxide film 6 (the second insulating film). The lanthanum oxide film 6 is made of lanthanum oxide ($La_2O_3$) and formed in both the nMOS region $R_{nMOS}$ and the pMOS region $R_{pMOS}$.

Figure 4:
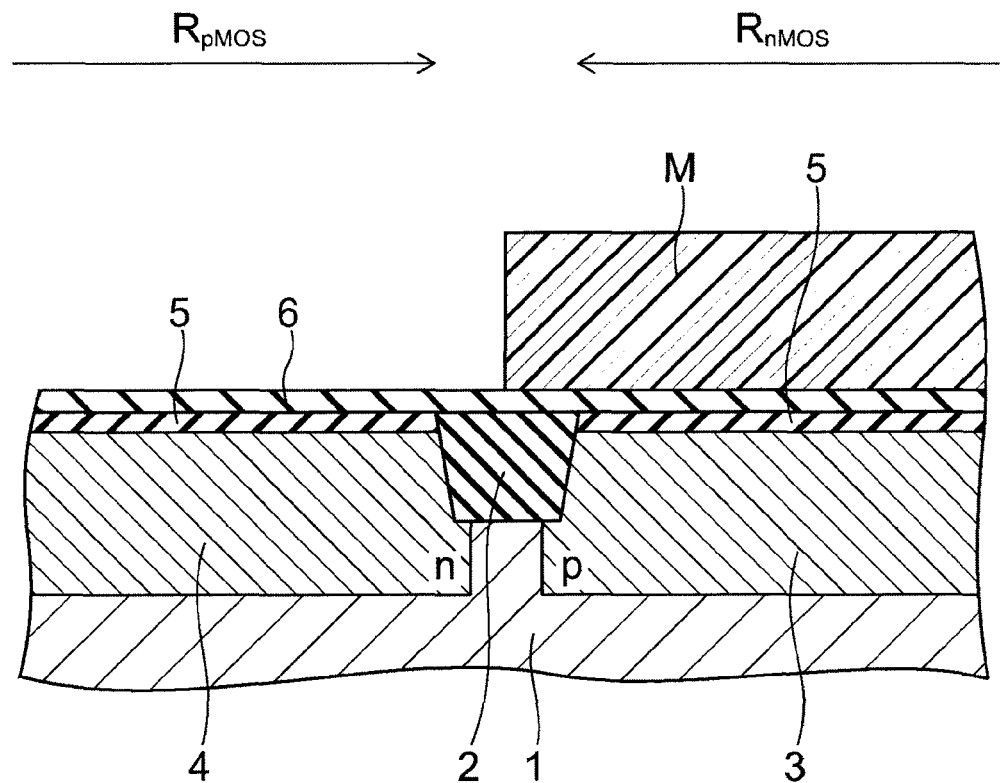

Then, as illustrated in FIG. 4, a photoresist film is formed on the entire surface of the lanthanum oxide film 6. The photoresist film is patterned by lithography to form a resist mask M to cover the nMOS region $R_{nMOS}$ and expose the pMOS region $R_{pMOS}$.

Figure 5:
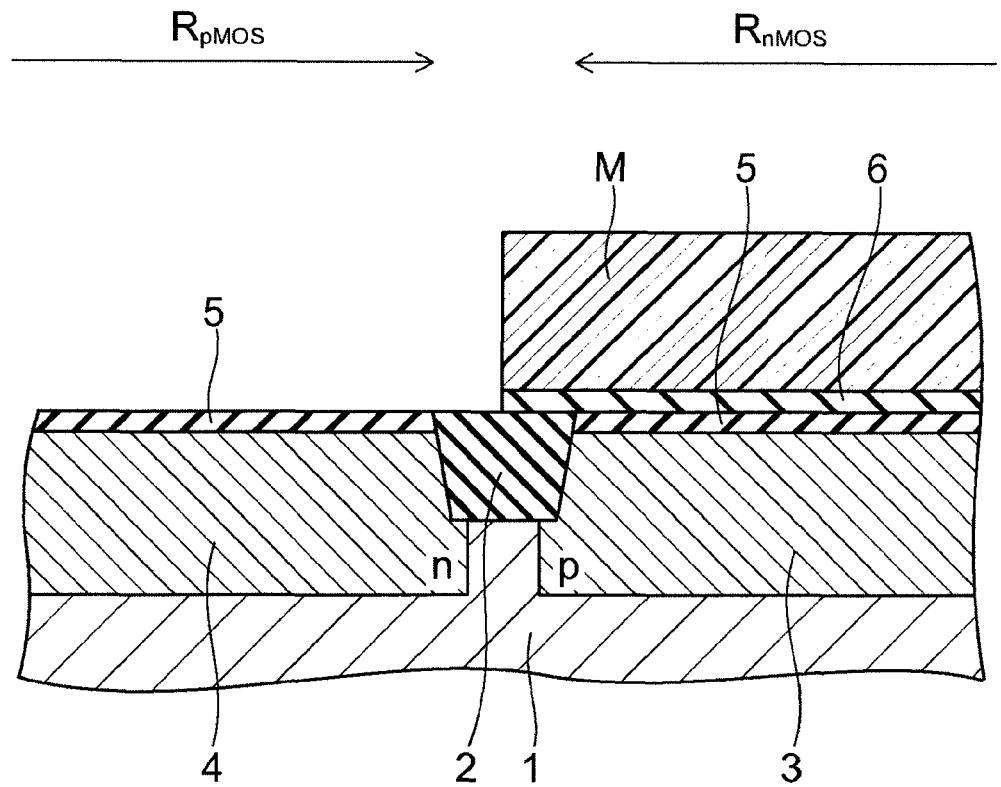

Continuing as illustrated in FIG. 5, etching such as wet etching using a dilute hydrochloric acid aqueous solution is performed using the resist mask M as a mask to selectively remove the lanthanum oxide film 6. Thereby, the lanthanum oxide film 6 is left in the nMOS region $R_{nMOS}$ and removed from the pMOS region $R_{pMOS}$. Subsequently, the resist mask M is removed using an organic solvent such as paint thinner.

Figure 6:
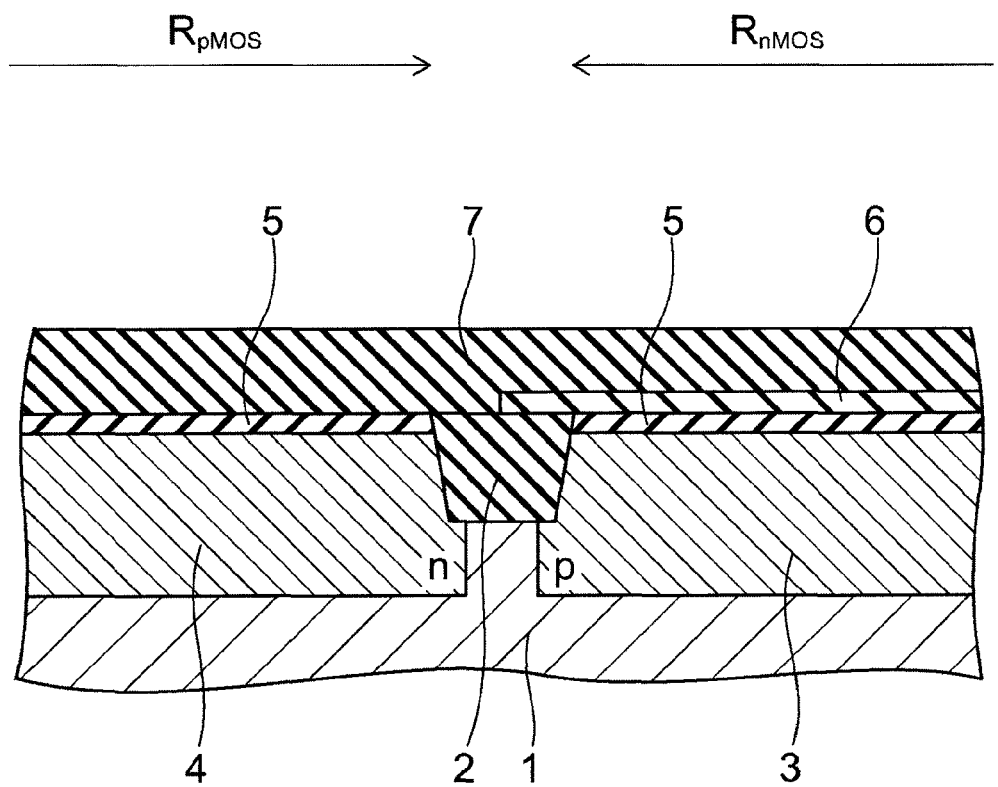

Then, as illustrated in FIG. 6, a hafnium silicate (HfSiO) film is deposited with a thickness of, for example, 2 nm on the entire surface. Nitrogen is introduced by performing nitriding such as plasma nitriding on the hafnium silicate film. Then, heat treatment is performed using, for example, a nitrogen-diluted oxygen atmosphere (with a dilution ratio of 0.1%) at a pressure of 5 Torr (about 670 Pa) and a temperature of 1,000 degrees for 10 seconds to stabilize the nitrogen introduced into the hafnium silicate film. Thereby, a nitrided hafnium silicate film 7 (the third insulating film) is formed to cover the silicon oxynitride film 5 and the lanthanum oxide film 6. In other words, the nitrided hafnium silicate film 7 is formed on the silicon oxynitride film 5 in the pMOS region $R_{pMOS}$ and on the lanthanum oxide film 6 in the nMOS region $R_{nMOS}$.

The nitrided hafnium silicate film 7 is made of nitrided hafnium silicate (HfSiO) and is formed in both the nMOS region $R_{nMOS}$ and the pMOS region $R_{pMOS}$. Accordingly, the lower face of the nitrided hafnium silicate film 7 contacts the upper face of the lanthanum oxide film 6 in the nMOS region $R_{nMOS}$; and the lower face of the nitrided hafnium silicate film 7 contacts the upper face of the silicon oxynitride film 5 in the pMOS region $R_{pMOS}$. The nitrided hafnium silicate film 7 is a so-called high dielectric constant material (high-k film). The dielectric constant of nitrided hafnium silicate (HfSiON) is higher than the dielectric constant of silicon oxide and silicon oxynitride.

Figure 7:
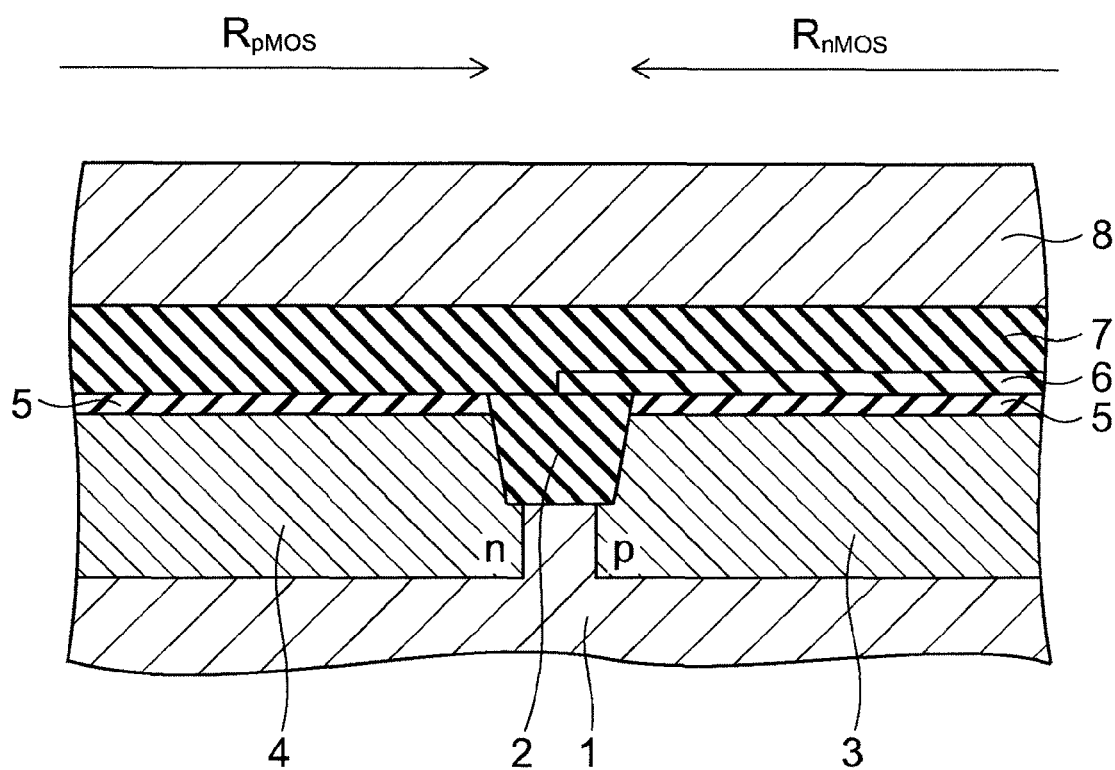

Continuing as illustrated in FIG. 7, an aluminum-containing titanium nitride film 8 made of titanium nitride (TiN) containing aluminum (Al) is formed with a thickness of, for example, 7 nm as a conducting film on the nitrided hafnium silicate film 7.

Figure 8:
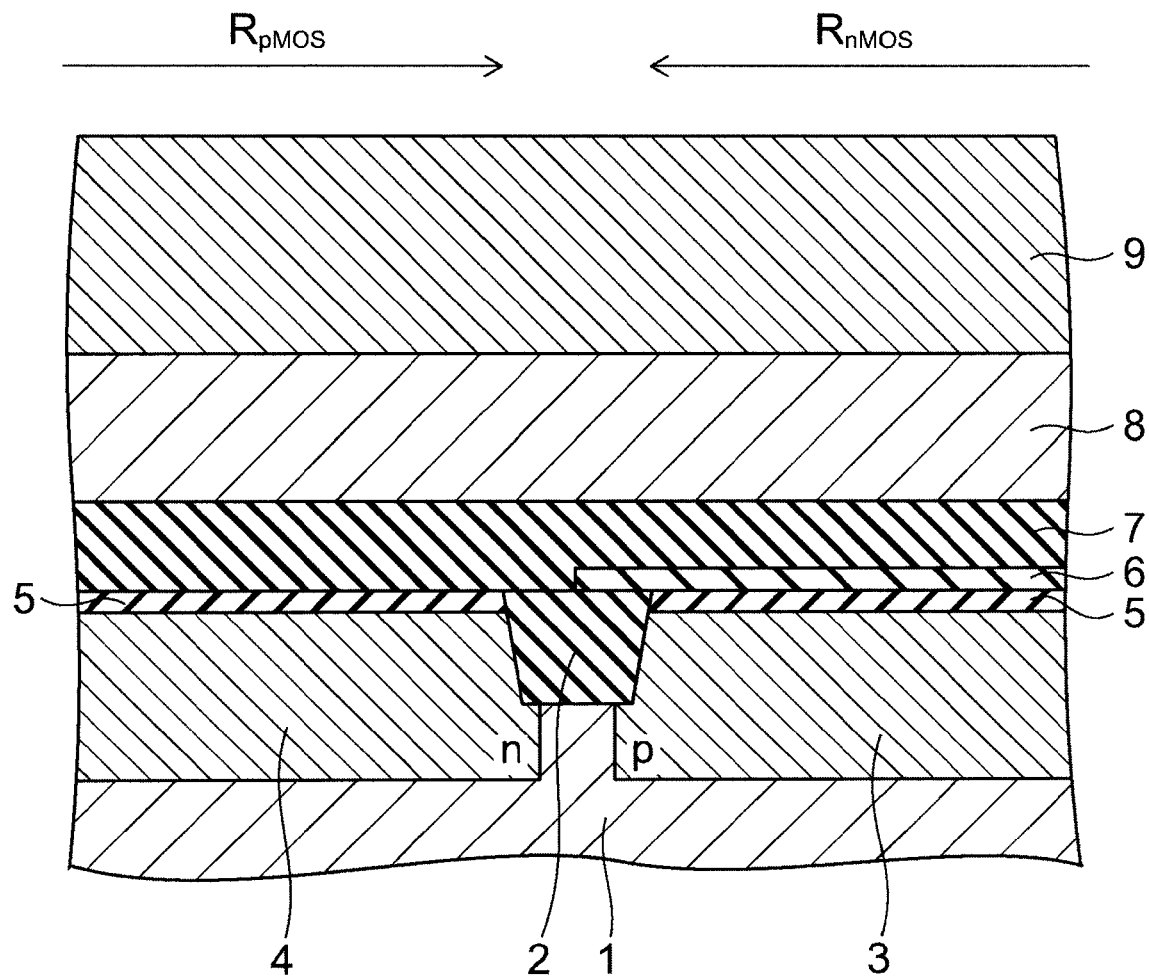

Then, as illustrated in FIG. 8, a polysilicon film 9 is formed with a thickness of, for example, 60 nm on the aluminum-containing titanium nitride film 8. The aluminum-containing titanium nitride film 8 and the polysilicon film 9 are formed in both the nMOS region $R_{nMOS}$ and the pMOS region $R_{pMOS}$.

Figure 9:
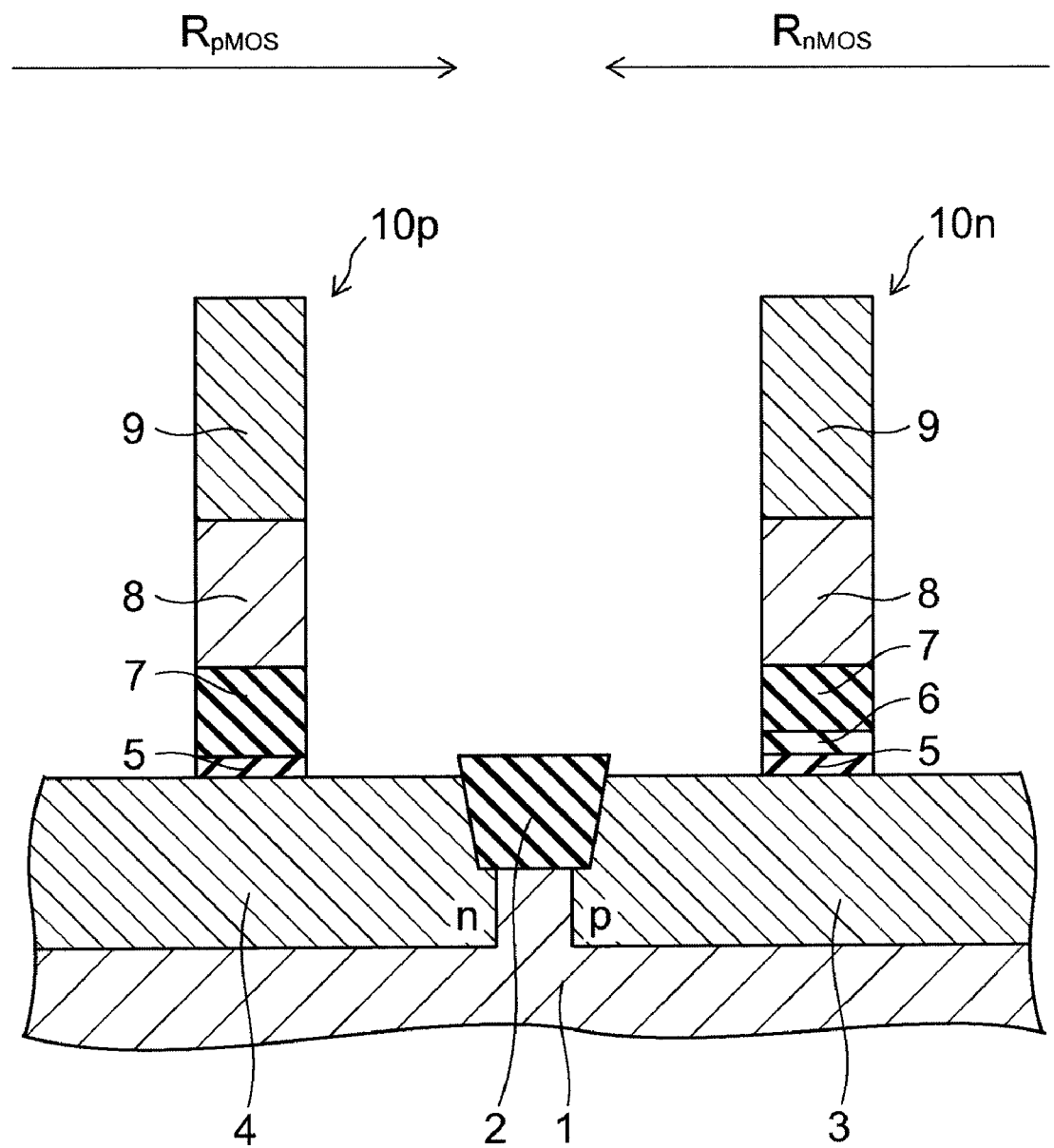

Continuing as illustrated in FIG. 9, RIE (Reactive Ion Etching) is performed to selectively remove the polysilicon film 9, the aluminum-containing titanium nitride film 8, the nitrided hafnium silicate film 7, the lanthanum oxide film 6, and the silicon oxynitride film 5 to leave a portion in the nMOS region $R_{nMOS}$ and a portion in the pMOS region $R_{pMOS}$. As a result, a stacked structural unit 10n patterned into a gate electrode configuration is constructed in the portion in the nMOS region $R_{nMOS}$; and a stacked structural unit 10p patterned into a gate electrode configuration is constructed in the portion in the pMOS region $R_{pMOS}$. Thus, the aluminum-containing titanium nitride film 8 is formed on the nitrided hafnium silicate film 7 in the portion in the nMOS region $R_{nMOS}$ and the portion in the pMOS region $R_{pMOS}$ as a conducting film containing aluminum. Thereby, the basic structure of the gate stacks is completed.

The stacked structural unit 10n includes the silicon oxynitride film 5, the lanthanum oxide film 6, the nitrided hafnium silicate film 7, the aluminum-containing titanium nitride film 8, and the polysilicon film 9 stacked in this order from the lower layer side. On the other hand, the stacked structural unit 10p includes the silicon oxynitride film 5, the nitrided hafnium silicate film 7, the aluminum-containing titanium nitride film 8, and the polysilicon film 9 stacked in this order from the lower layer side; and the lanthanum oxide film 6 is not provided therein.

Then, as illustrated in FIG. 10, side walls 11 are formed on both side faces of each of the patterned stacked structural units 10n and 10p by normal methods. Then, a resist mask (not illustrated) is formed to cover the pMOS region $R_{pMOS}$. In a state in which the nMOS region $R_{nMOS}$ is exposed, donors are ion-implanted using the stacked structural unit 10n and the side walls 11 on the sides thereof as a mask. Then, a resist mask (not illustrated) is formed to cover the nMOS region $R_{nMOS}$. In a state in which the pMOS region $R_{pMOS}$ is exposed, acceptors are ion-implanted using the stacked structural unit 10p and the side walls 11 on the sides thereof as a mask.

Then, annealing is performed to activate the donors and the acceptors introduced into the semiconductor substrate.

Thereby, n+-type source/drain regions 12 are formed at both sides of the region directly below the stacked structural unit 10n in the upper layer portion of the semiconductor substrate 1 in the nMOS region $R_{nMOS}$; and p+-type source/drain regions 13 are formed on both sides of the region directly below the stacked structural unit 10p in the upper layer portion of the semiconductor substrate 1 in the pMOS region $R_{pMOS}$.

The annealing causes the aluminum (Al) contained in the aluminum-containing titanium nitride film 8 to diffuse into the nitrided hafnium silicate film 7, and the nitrided hafnium silicate film 7 changes into a nitrided hafnium aluminum silicate film 14. The aluminum diffused in the pMOS region $R_{pMOS}$ reaches the interface between the nitrided hafnium silicate film 7 and the silicon oxynitride film 5. On the other hand, in the nMOS region $R_{nMOS}$, diffusion of the aluminum is obstructed by the lanthanum oxide film 6 and does not reach the interface between the lanthanum oxide film 6 and the silicon oxynitride film 5. Thus, in the pMOS region $R_{pMOS}$, the heat treatment for activating the impurity in the source/drain regions is utilized to diffuse the aluminum contained in the aluminum-containing titanium nitride film 8 (the conducting film) to the interface between the silicon oxynitride film 5 (the first insulating film) and the nitrided hafnium aluminum silicate film 14 (the third insulating film). Subsequently, an inter-layer insulating film (not illustrated) and an upper wiring layer (not illustrated) are formed, and the wafer is diced. Thereby, a semiconductor device 20 according to this embodiment is manufactured.

The configuration of the semiconductor device according to this embodiment manufactured as described above will now be described.

As illustrated in FIG. 10, the semiconductor device 20 according to this embodiment is a semiconductor device in which the nMOS region $R_{nMOS}$ and the pMOS region $R_{pMOS}$ are set and a CMOS is formed. The semiconductor substrate 1 made of, for example, monocrystalline silicon is provided in the semiconductor device 20. In the upper layer portion of the semiconductor substrate 1, the p-type well 3 is formed in the nMOS region $R_{nMOS}$, the n-type well 4 is formed in the pMOS region $R_{pMOS}$, and the element separation film 2 made of, for example, silicon oxide is filled into the boundary portion between the nMOS region $R_{nMOS}$ and the pMOS region $R_{pMOS}$.

The stacked structural unit 10n is provided on the semiconductor substrate 1 in a portion of the nMOS region $R_{nMOS}$. On the other hand, the stacked structural unit 10p is provided on the semiconductor substrate 1 in the pMOS region $R_{pMOS}$. The stacked structural unit 10n includes the silicon oxynitride film 5 (the first insulating film), the lanthanum oxide film 6 (the second insulating film), the nitrided hafnium aluminum silicate film 14 (the third insulating film), the aluminum-containing titanium nitride film 8 (the conducting film), and the polysilicon film 9 stacked in this order from the lower layer side. On the other hand, the stacked structural unit 10p includes the silicon oxynitride film 5 (the first insulating film), the nitrided hafnium aluminum silicate film 14 (the third insulating film), the aluminum-containing titanium nitride film 8 (the conducting film), and the polysilicon film 9 stacked in this order from the lower layer side. The lanthanum oxide film 6 (the second insulating film) is not provided in the stacked structural unit 10p.

In the stacked structural unit 10n and 10p, the stacked film made of the silicon oxynitride film 5, the lanthanum oxide film 6, and the nitrided hafnium aluminum silicate film 14 function as the gate insulating film; and the stacked film made of the aluminum-containing titanium nitride film 8 and the polysilicon film 9 function as the gate electrode.

Further, the side walls 11 are formed on both of the side faces of each of the stacked structural unit 10n and 10p. In the upper layer portion of the semiconductor substrate 1, the n+-type source/drain regions 12 are formed on both sides of the region directly below the stacked structural unit 10n, and the region between the source/drain regions 12 of the p-type well 3 forms a channel region. On the other hand, the p+-type source/drain regions 13 are formed on both sides of the region directly below the stacked structural unit 10p, and the region between the source/drain regions 13 of the n-type well 4 forms a channel region.

The operations of the semiconductor device according to this embodiment will now be described.

In the pMOS region $R_{pMOS}$ of the semiconductor device 20, the silicon oxynitride film 5, the nitrided hafnium silicate film 7, and the aluminum-containing titanium nitride film 8 are stacked in this order in the processes illustrated in FIG. 2 to FIG. 7. Thereby, during the annealing for activating the impurities in the process illustrated in FIG. 10, the aluminum in the aluminum-containing titanium nitride film 8 diffuses into the nitrided hafnium silicate film 7. As a result, the nitrided hafnium silicate film 7 changes into the nitrided hafnium aluminum silicate film 14, and the aluminum reaches the interface between the silicon oxynitride film 5 and the nitrided hafnium aluminum silicate film 14. Thereby, an electric dipole having the silicon oxynitride film 5 side as the negative pole and the nitrided hafnium aluminum silicate film 14 side as the positive pole is formed at the interface. As a result, the effective work function of the gate electrode increases and the threshold voltage of the pMOS decreases.

On the other hand, supposing the case where the aluminum reaches the interface between the silicon oxynitride film 5 and the lanthanum oxide film 6 in the nMOS region $R_{nMOS}$, an electric dipole such as that described above would be formed, the effective work function of the gate electrode would increase, and the threshold voltage of the nMOS would increase. However, in this embodiment, the lanthanum oxide film 6 prevents the diffusion of the aluminum. Therefore, the electric dipole such as that described above is not formed, and the aluminum does not cause the threshold voltage of the nMOS to increase.

Conversely, because lanthanum exists at the interface between the silicon oxynitride film 5 and the lanthanum oxide film 6, an electric dipole is formed having the silicon oxynitride film 5 side as the positive pole and the lanthanum oxide film 6 side as the negative pole. As a result, the effective work function of the gate electrode decreases, and the threshold voltage of the nMOS decreases. Such an electric dipole is not formed in the pMOS region $R_{pMOS}$ because the lanthanum oxide film 6 is not provided.

The effects of this embodiment will now be described.

In this embodiment, the nitrided hafnium aluminum silicate film 14 having a dielectric constant higher than those of the silicon oxide film and the silicon oxynitride film is provided in the gate insulating film. Thereby, the electrical film thickness can be thin while maintaining a thick physical film thickness of the gate insulating film. As a result, the current driving capacity of the nMOS and the pMOS can be increased while suppressing the leak current. Thereby, a CMOS device can be realized having both reduced power consumption and increased performance.

Also in this embodiment, the lower layer portion of the gate electrode is formed of the aluminum-containing titanium nitride film 8, i.e., the conducting film. Thereby, a depletion layer is prevented from forming in the portion of the gate electrode contacting the gate insulating film. As a result, the effective film thickness of the gate insulating film can be made even thinner.

Further, in this embodiment as described above, the threshold voltage of the pMOS is reduced by disposing aluminum at the interface between the silicon oxynitride film 5 and the nitrided hafnium aluminum silicate film 14. On the other hand, in the nMOS, the lanthanum oxide film 6 is provided to prevent the aluminum from reaching the silicon oxynitride film 5 and prevent the existence of the aluminum from causing the threshold voltage to increase. Additionally, providing the lanthanum oxide film 6 decreases the threshold voltage of the nMOS by disposing lanthanum at the interface between the silicon oxynitride film 5 and the lanthanum oxide film 6. Thus, according to this embodiment, the threshold voltages of both the nMOS and the pMOS can be reduced. Thereby, in the semiconductor device 20, the nMOS and the pMOS can be driven by low gate voltages.

Moreover, according to this embodiment, the work functions of the gate electrode materials of the nMOS and the pMOS are adjusted to simultaneously reduce the threshold voltages only by forming the lanthanum oxide film 6 in the nMOS region $R_{nMOS}$. Therefore, it is not necessary to separately make the gate electrodes of the nMOS and the pMOS, and the manufacturing process of the semiconductor device can be simplified. Thereby, the manufacturing costs of the semiconductor device can be suppressed, fluctuations of manufacturing can be suppressed, and the yield can be improved.

Also, according to this embodiment, the diffusion of the aluminum described above is performed by utilizing the heat treatment for activating impurities in the source/drain regions. Thereby, it is not necessary to perform dedicated processing to diffuse the aluminum, and the manufacturing process can be simplified even more.

A second embodiment of the invention will now be described.

Figure 11:
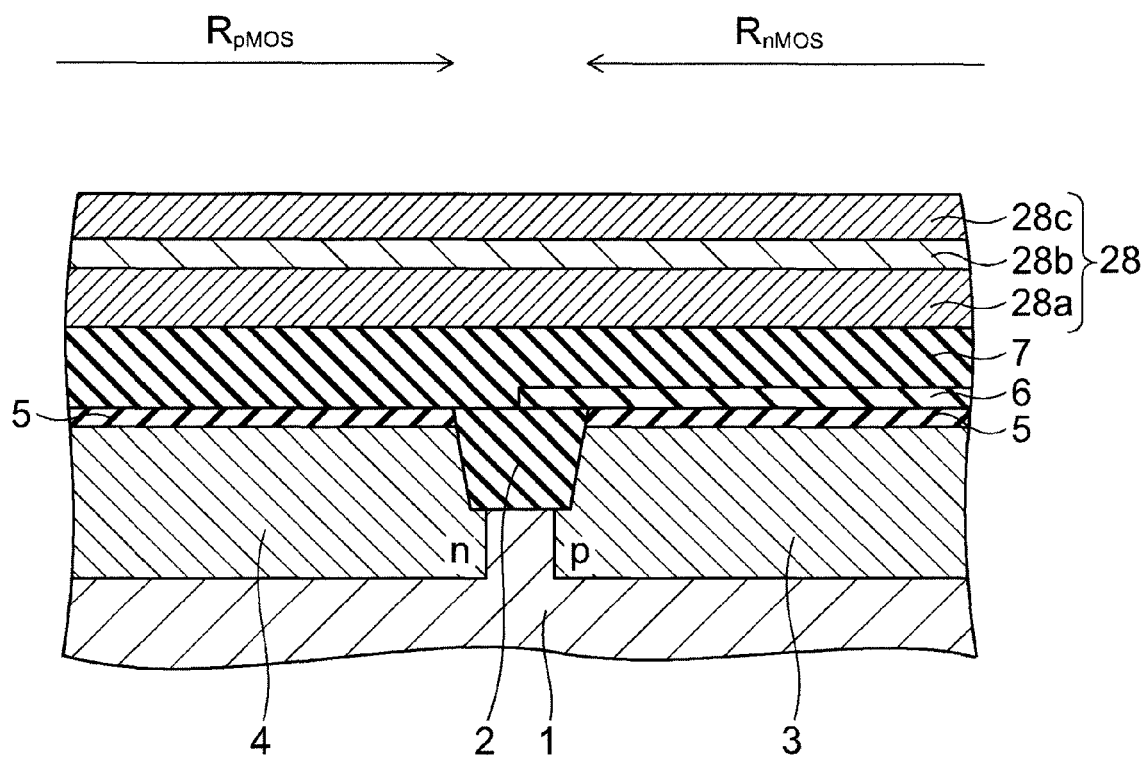
FIG. 11 is a process cross-sectional view illustrating a method for manufacturing a semiconductor device according to a second embodiment of the invention.

FIG. 11 is a process cross-sectional view illustrating a method for manufacturing a semiconductor device according to this embodiment.

Figure 12:
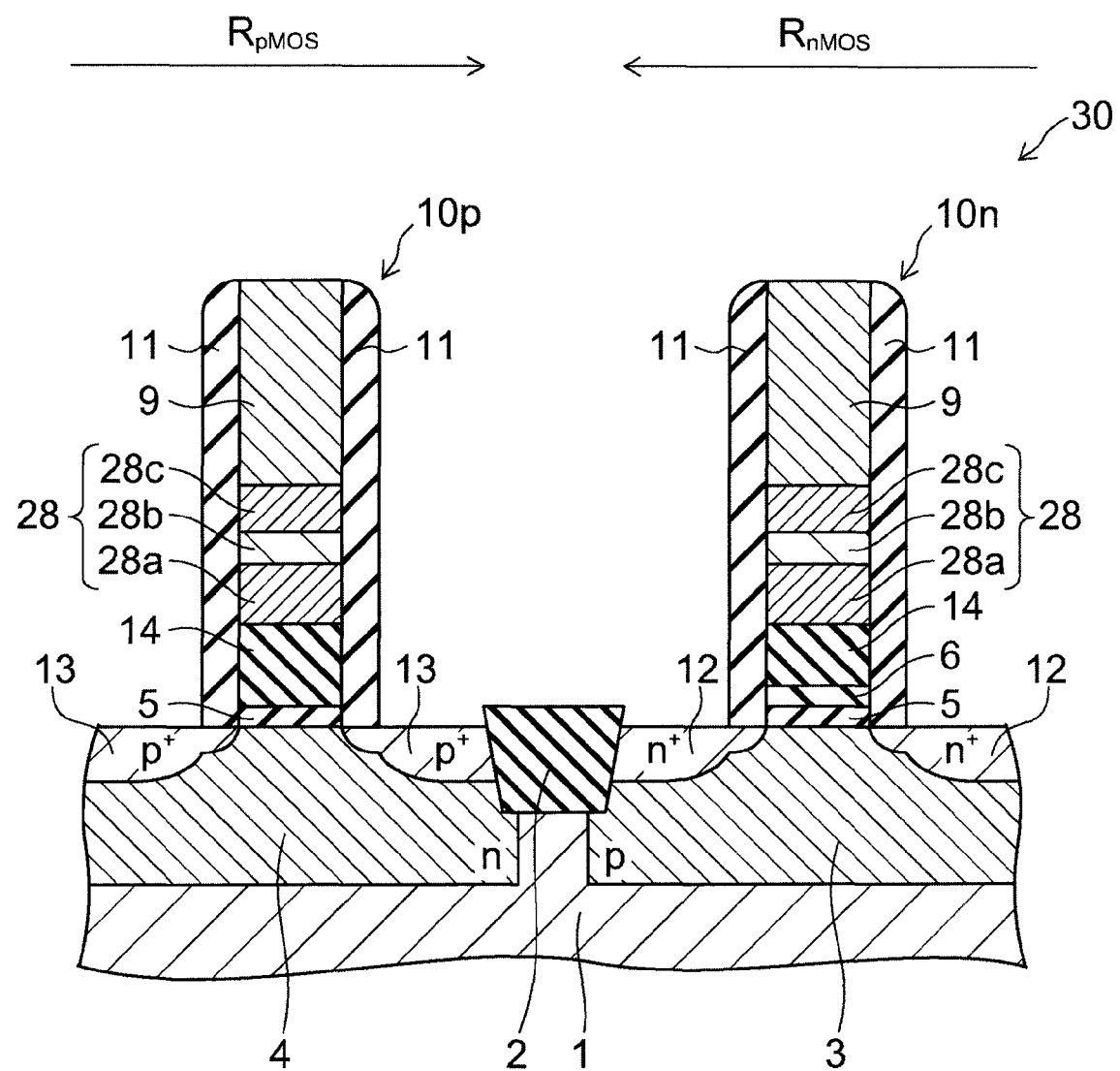
FIG. 12 is a cross-sectional view illustrating the semiconductor device according to the second embodiment.

FIG. 12 is a cross-sectional view illustrating the semiconductor device according to this embodiment.

In this embodiment, the aluminum-containing titanium nitride film 8 (referring to FIG. 10) of the first embodiment described above is replaced with a three layer film 28 (TiN/Al/TiN) as the conducting film.

First, similarly to the first embodiment described above, the processes illustrated in FIG. 1 to FIG. 6 are executed, and the structural unit illustrated in FIG. 6 is constructed.

Then, as illustrated in FIG. 11, a lower layer film 28a made of titanium nitride (TiN) is formed with a thickness of, for example, 2 nm on the nitrided hafnium silicate film 7. Then, a middle layer film 28b made of aluminum is formed with a thickness of, for example, 1 nm by, for example, sputtering. Subsequently, an upper layer film 28c made of titanium nitride is formed with a thickness of, for example, 1.5 nm. Thereby, the lower layer film 28a, the middle layer film 28b, and the upper layer film 28c are stacked in this order from the lower layer side to form the three layer film 28.

The subsequent processes are similar to the processes illustrated in FIG. 8 to FIG. 10. In other words, the polysilicon film 9 is deposited on the three layer film 28, the stacked film from the silicon oxynitride film 5 to the polysilicon film 9 is patterned, and the stacked structural unit having a gate electrode configuration is formed. Then, the side walls 11 are formed on both side faces of each of the stacked structural units, and impurities are implanted into the upper layer portion of the semiconductor substrate 1. Annealing is then performed to activate the implanted impurities, and the source/drain regions 12 and 13 are formed.

In this embodiment, the annealing for activating the impurities described above causes the aluminum forming the middle layer film 28b of the three layer film 28 to diffuse via the lower layer film 28a and the upper layer film 28c. Thereby, the compositions of the lower layer film 28a and the upper layer film 28c become titanium nitride containing aluminum. The nitrided hafnium silicate film 7 changes into the nitrided hafnium aluminum silicate film 14. In the pMOS region $R_{pMOS}$, the aluminum reaches the interface between the nitrided hafnium aluminum silicate film 14 and the silicon oxynitride film 5.

Thus, a semiconductor device 30 illustrated in FIG. 12 is manufactured. In the semiconductor device 30, the three layer film 28 is provided between the nitrided hafnium silicate film 7 and the polysilicon film 9. The three layer film 28 includes the lower layer film 28a made of aluminum-containing titanium nitride, the middle layer film 28b made of aluminum, and the upper layer film 28c made of aluminum-containing titanium nitride stacked in this order from the lower layer side.

According to this embodiment, an alumina film is prevented from forming at the interface between the upper layer film 28c and the polysilicon film 9 by depositing the polysilicon film 9 on the upper layer film 28c which is made of titanium nitride and does not include aluminum, and the thickness of the gate insulating film can be prevented from increasing. The electrical film thickness of the gate insulating film can be made thin by disposing the middle layer film 28b made of metal aluminum in the gate insulating film. Otherwise, the manufacturing method, configuration, operations, and effects of this embodiment are similar to those of the first embodiment described above.

A third embodiment of the invention will now be described.

Figure 13:
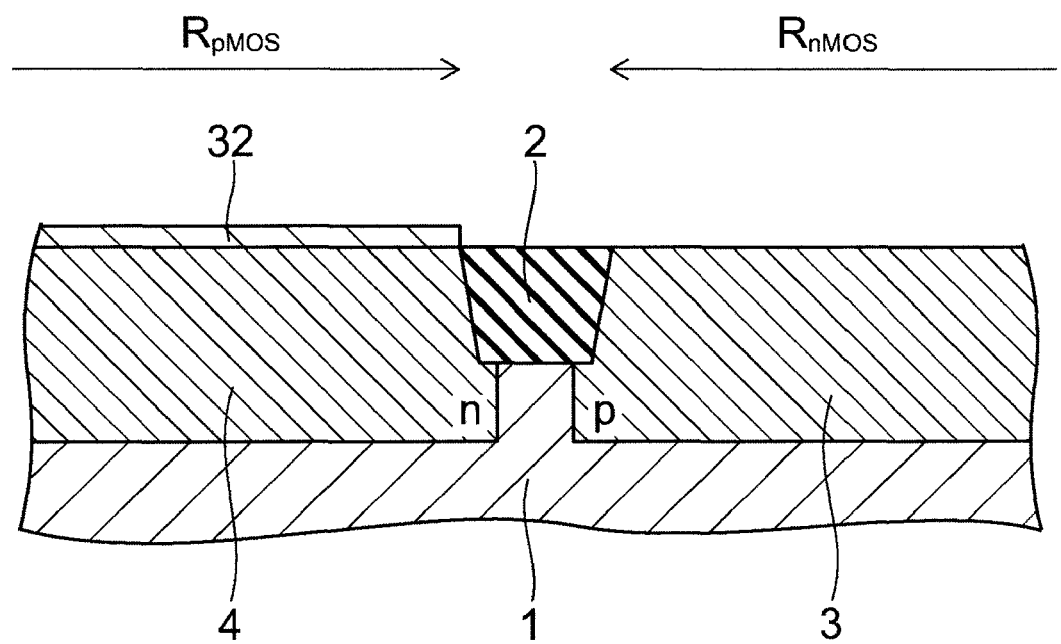
FIG. 13 is a process cross-sectional view illustrating a method for manufacturing a semiconductor device according to a third embodiment of the invention.

FIG. 13 is a process cross-sectional view illustrating a method for manufacturing a semiconductor device according to this embodiment.

Figure 14:
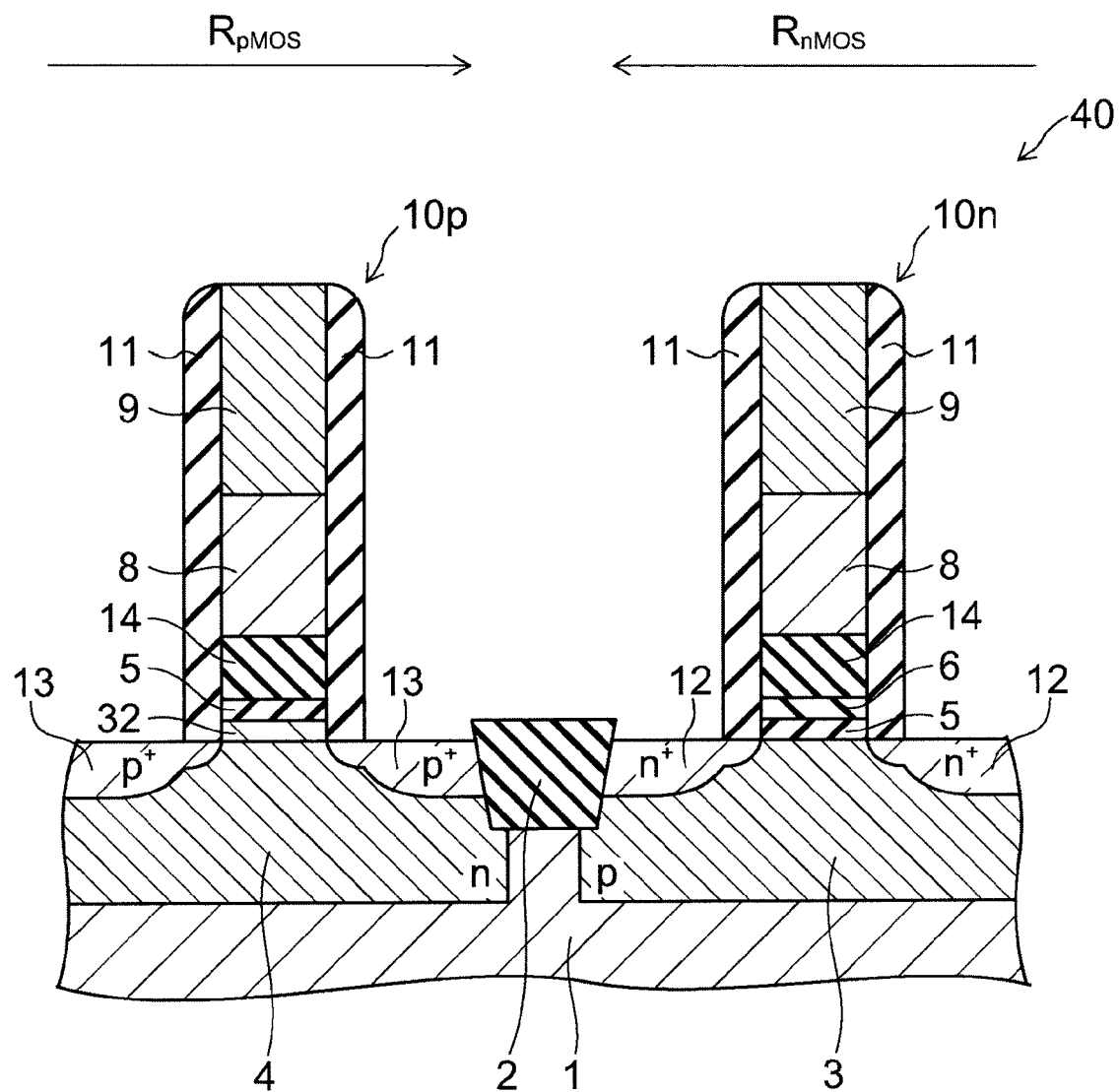
FIG. 14 is a cross-sectional view illustrating the semiconductor device according to the third embodiment.

FIG. 14 is a cross-sectional view illustrating the semiconductor device according to this embodiment.

The semiconductor device according to this embodiment is different from the first embodiment described above in that a silicon germanide (SiGe) epitaxial layer is formed between the semiconductor substrate 1 made of silicon and the silicon oxynitride film 5 in the pMOS region $R_{pMOS}$.

The method for manufacturing the semiconductor device according to this embodiment will now be described.

First, as illustrated in FIG. 1, the semiconductor substrate 1 made of silicon is prepared and the element separation film 2 is formed in the boundary portion between the nMOS region $R_{nMOS}$ and the pMOS region $R_{pMOS}$. The p-type well 3 is formed in the nMOS region $R_{nMOS}$, and the n-type well 4 is formed in the pMOS region $R_{pMOS}$.

Then, as illustrated in FIG. 13, silicon germanide (SiGe) is epitaxially grown on the upper face of the semiconductor substrate 1 in the pMOS region $R_{pMOS}$ to form a silicon germanide epitaxial layer 32. The thickness of the silicon germanide epitaxial layer 32 is, for example, 7 to 10 nm. The silicon germanide epitaxial layer 32 is not formed in the nMOS region $R_{nMOS}$.

The subsequent manufacturing method is similar to the methods illustrated in FIG. 2 to FIG. 10. Thereby, a semiconductor device 40 illustrated in FIG. 14 is manufactured. In the semiconductor device 40 according to this embodiment, the silicon germanide epitaxial layer 32 is formed in the pMOS region $R_{pMOS}$ between the n-type well 4 of the semiconductor substrate 1 and the silicon oxynitride film 5.

By providing the silicon germanide epitaxial layer 32 in the pMOS region $R_{pMOS}$ in this embodiment, the threshold voltage of the pMOS can be reduced even more. Otherwise, the manufacturing method, configuration, operations, and effects of this embodiment are similar to those of the first embodiment described above.

Hereinabove, the invention is described with reference to exemplary embodiments. However, the invention is not limited to these embodiments. For example, the embodiments described above may be implemented in combination with each other. Also, additions, deletions, or design modifications of components or additions, omissions, or condition modifications of processes appropriately made by one skilled in the art in regard to the embodiments described above are within the scope of the invention to the extent that the purport of the invention is included.

For example, although the embodiments described above illustrate an example in which the semiconductor substrate 1 is formed of silicon, the invention is not limited thereto. The semiconductor substrate 1 may be formed of a semiconductor material other than silicon. For example, the semiconductor substrate 1 may be formed of silicon germanide (SiGe) or a semiconductor material not including silicon. However, in the case where the semiconductor substrate 1 is formed of silicon, the silicon oxynitride film 5 can be easily formed by performing oxidation treatment and nitriding on the upper face of the semiconductor substrate 1 in the process illustrated in FIG. 2.

Although the embodiments described above illustrate an example in which the silicon oxynitride film 5 is provided as the first insulating film, the invention is not limited thereto. A silicon oxide film may be provided instead of the silicon oxynitride film.

Although the embodiments described above illustrate an example in which the lanthanum oxide film 6 is provided only in the nMOS region $R_{nMOS}$ as the second insulating film to prevent diffusion of aluminum, the invention is not limited thereto. Any film capable of obstructing the diffusion of aluminum can prevent effects of aluminum from increasing the threshold voltage of the nMOS. However, it is favorable to form the second insulating film of a material including a group 2A element or a group 3B element to form an electric dipole having the positive pole on the silicon oxynitride film 5 side and the negative pole on the lanthanum oxide film 6 side at the interface with the silicon oxynitride film 5 because the threshold voltage of the nMOS can be reduced. Because lanthanum (La) is a rare-earth element in the group 3B, lanthanum oxide ($La_2O_3$) corresponds to a material containing a group 2A element or a group 3B element. For example, lanthanum nitride may be used instead of lanthanum oxide.

Although the embodiments described above illustrate an example in which the nitrided hafnium aluminum silicate (AlSiHfN) film 14 is provided as the high-k film (the third insulating film), the invention is not limited thereto. It is sufficient that the high-k film is formed of an insulative material having a dielectric constant higher than the dielectric constants of silicon oxide and silicon oxynitride. Because aluminum is diffused into the high-k film, the high-k film always contains aluminum in the completed semiconductor device. For example, a hafnium silicate film containing aluminum, a zirconium silicate film, a hafnium oxide film, a zirconium oxide film, a hafnium zirconium oxide film, a hafnium zirconium silicate film, and the like may be used as the high-k film to obtain effects similar to those of the embodiments described above.

Although the embodiments described above illustrate an example in which the aluminum-containing titanium nitride film 8 is provided as the conducting film forming the metal gate electrode, the invention is not limited thereto. It is sufficient that a film formed of a conductive material containing aluminum is used. Such a conductive material may include, for example, a material having aluminum added to tantalum nitride, hafnium nitride, zirconium nitride, molybdenum nitride, tungsten nitride, tantalum carbide, and the like.

However, the threshold voltages of both the pMOS and the nMOS can be easily adjusted in the case where titanium nitride is used as the base material of the conducting film because the work function of titanium nitride itself is a value between the work function of the gate material required to reduce the threshold voltage of the pMOS and the work function of the gate material required to reduce the threshold voltage of the nMOS. In other words, the threshold voltage can be reduced by diffusing aluminum for the pMOS and adding lanthanum for the nMOS.

Although it is possible to form the conducting film of only aluminum, aluminum has a low melting point and poor heat resistance. Therefore, the subsequent manufacturing process is constrained. If constraints of the manufacturing process do not exist, it is possible to form the metal gate electrode of only aluminum.

Although the embodiments described above illustrate an example in which the upper portion of the gate electrode is formed of the polysilicon film 9, the invention is not limited thereto. The polysilicon film 9 may not be provided, and the upper portion of the gate electrode may be formed of another conducting film.

Although the embodiments described above illustrate an example in which the silicon oxynitride film 5, the lanthanum oxide film 6, and the nitrided hafnium aluminum silicate film 14 forming the gate insulating film are patterned into the same configuration as the aluminum-containing titanium nitride film 8 and the polysilicon film 9 forming the gate electrode, the invention is not limited thereto. It is sufficient that the gate insulating film is disposed between the gate electrode and the semiconductor substrate. For example, the gate insulating film may not be patterned and may be disposed on the entire nMOS region and pMOS region.

Although the embodiments described above illustrate an example in which the annealing for activating the impurities implanted into the source/drain regions is utilized to diffuse the aluminum in the aluminum-containing titanium nitride film 8 to the silicon oxynitride film 5 in the pMOS region, the invention is not limited thereto. Another heat treatment process may be utilized to diffuse the aluminum, or a dedicated processing for diffusing the aluminum may be implemented.

The invention claimed is:

1. A semiconductor device including an nMOS region and a pMOS region set therein, the device comprising:
    a semiconductor substrate;
    a first insulating film including silicon and oxygen formed on the semiconductor substrate in the nMOS region and the pMOS region;
    a second insulating film formed on the first insulating film in the nMOS region and not formed in the pMOS region;
    a third insulating film formed on the first insulating film in the pMOS region and on the second insulating film in the nMOS region, the third insulating film containing aluminum and having a dielectric constant higher than a dielectric constant of the first insulating film; and
    a conducting film containing aluminum formed on the third insulating film in the nMOS region and the pMOS region.

2. The device according to claim 1, wherein the second insulating film contains a group 2A element or a group 3B element.

3. The device according to claim 1, wherein the second insulating film is formed of lanthanum oxide.

4. The device according to claim 1, wherein the conducting film includes titanium nitride.

5. The device according to claim 1, wherein the semiconductor substrate is formed of silicon.

6. The device according to claim 1, wherein the third insulating film includes hafnium.

7. The device according to claim 1, wherein the first insulating film is formed of silicon oxide or silicon oxynitride.

* * * * *